United States Patent
Li et al.

(10) Patent No.: US 12,422,718 B2
(45) Date of Patent: Sep. 23, 2025

(54) DRIVER IC AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Huatao Li, Beijing (CN); Zhiguang Zhang, Beijing (CN); Zhongjie Wang, Beijing (CN); Pan Zhao, Beijing (CN); Zhiliang Jiang, Beijing (CN); Ziyang Yu, Beijing (CN); Shilong Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,002

(22) PCT Filed: Jan. 20, 2022

(86) PCT No.: PCT/CN2022/072903
§ 371 (c)(1),
(2) Date: Jan. 13, 2023

(87) PCT Pub. No.: WO2023/137656
PCT Pub. Date: Jul. 27, 2023

(65) Prior Publication Data
US 2024/0243083 A1    Jul. 18, 2024

(51) Int. Cl.
G02F 1/1345      (2006.01)
G09G 3/20        (2006.01)
(Continued)

(52) U.S. Cl.
CPC ........ *G02F 1/13452* (2013.01); *G02F 1/1345* (2013.01); *G09G 3/20* (2013.01); *G09G 3/296* (2013.01); *H01L 24/05* (2013.01); *H01L 24/06* (2013.01); *H10K 19/80* (2023.02); *H10K 59/131* (2023.02); *H01L 2224/05553* (2013.01); *H01L 2224/06152* (2013.01); *H01L 2924/1426* (2013.01); *H10K 59/90* (2023.02)

(58) Field of Classification Search
None
See application file for complete search history.

(56) References Cited

U.S. PATENT DOCUMENTS 5,592,199 A * 1/1997 Kawaguchi ......... H01L 23/4985
345/206
2021/0091162 A1* 3/2021 Kim .................... G02F 1/13452

* cited by examiner

*Primary Examiner* — Feifei Yeung Lopez
(74) *Attorney, Agent, or Firm* — ArentFox Schiff LLP; Michael Fainberg (57) ABSTRACT

Provided are a driver IC and a display device. The driver IC includes at least one GOA pad area. Each of the at least one GOA pad area includes a plurality of first pads arranged in a plurality of rows and a plurality of columns. Each of the plurality of columns of the first pads is divided into at least two first pad groups arranged independently of each other. Each of the at least two of the first pad groups includes at least two of the first pads adjacent to each other, and the first pads in each of the first pad groups are electrically connected with each other. The driver IC further includes a plurality of leads electrically connected with the first pad groups, and each of the first pad groups is electrically connected with a different lead.

20 Claims, 6 Drawing Sheets

(51) Int. Cl.
*G09G 3/296* (2013.01)
*H01L 23/00* (2006.01)
*H10K 19/80* (2023.01)
*H10K 59/131* (2023.01)
*H10K 59/90* (2023.01)

DRIVER IC AND DISPLAY DEVICE

FIELD

The present disclosure relates to the technical field of display, in particular to a driver integrated circuit, IC, and a display.

BACKGROUND

With the gradual maturity of flexible Organic Light-Emitting Diode, OLED, screen technology, foldable cell phones have become a popular form of future cell phones. A foldable cell phone can have a smaller screen area in a folded state, which is convenient for a user to carry. After being unfolded, the cell phone can become a tablet-sized communication device, so that the user can have a better visual experience. A foldable screen typically has a size of about 8 inches to 10 inches, which is obviously larger than that of an ordinary cell phone. To make a high-resolution foldable product, in general cases, two cascaded driver ICs are needed for support. If the high-resolution foldable product can be realized by one single foldable IC, the cost can be reduced. However, the current bonding technique of the single foldable IC is very difficult. Under extreme technical conditions, to make a driver IC that can support high resolution while ensuring both yield and cost, it is necessary to try and innovate constantly.

SUMMARY

Embodiments of the present disclosure provide a driver IC and a display device. The solutions are as follows.

An embodiment of the present disclosure provides a driver IC, including at least one gate driven on array, GOA, each of the at least one GOA pad area includes a plurality of first pads arranged in a plurality of rows and a plurality of columns; each of the plurality of columns of the first pads is divided into at least two first pad groups arranged independently of each other; each of the at least two first pad groups includes at least two of the first pads adjacent to each other, and the first pads in each of the first pad groups are electrically connected with each other; and the driver IC further including a plurality of leads electrically connected with the first pad groups, each of the first pad groups being electrically connected with a different lead.

In some embodiments, the driver IC includes: a ground signal pad area, an output signal pad area and an input signal pad area arranged on a periphery of the ground signal pad area and arranged opposite to each other, and a first pad area and a second pad area arranged on the periphery of the ground signal pad area and arranged opposite to each other;
the driver IC includes a first side and a second side arranged opposite to each other, and a third side and a fourth side arranged opposite to each other. The third side and the fourth side are respectively adjacent to the first side and the second side;
the output signal pad area corresponds to the first side, the input signal pad area corresponds to the second side, the first pad area corresponds to the third side, and the second pad area corresponds to the fourth side; and
the GOA pad area is arranged in an edge area of the output signal pad area.

In some embodiments, the output signal pad area further includes a data signal pad area, and the quantity of the GOA pad areas is two; the two GOA pad areas are respectively arranged on two ends of the data signal pad area.

In some embodiments, the two GOA pad areas are arranged symmetrically with respect to the data signal pad area.

In some embodiments, the leads electrically connected with the first pad groups away from the input signal pad area are directly led out from top ends of the first pad group.

In some embodiments, the leads electrically connected with the first pad groups close to the input signal pad area are connected with bottom ends of the first pad groups, and are led out from gaps between two adjacent columns of the first pads.

In some embodiments, for the GOA pad area close to the first pad area, the leads electrically connected with the first pad groups close to the input signal pad area are connected with bottom ends of the first pad groups, and are led out from gaps in the first pad area; and
for the GOA pad area close to the second pad area, the leads electrically connected with the first pad groups close to the input signal pad area are connected with bottom ends of the first pad groups, are led out from gaps in the second pad area.

In some embodiments, for the GOA pad area close to the first pad area, the leads electrically connected with one part of the first pad groups close to the input signal pad area are connected with bottom ends of the first pad groups, and are led out from gaps between two adjacent columns of the first pads; the leads electrically connected with the other part of the first pad groups close to the input signal pad area are connected with bottom ends of the first pad groups, and are led out from gaps in the first pad area; and
for the GOA pad area close to the second pad area, the leads electrically connected with one part of the first pad groups close to the input signal pad area are connected with bottom ends of the first pad groups, and are led out from gaps between two adjacent columns of the first pads; the leads electrically connected with the other part of the first pad groups close to the input signal pad area are connected with bottom ends of the first pad groups, and are led out from gaps in the second pad area.

In some embodiments, the driver IC includes: a ground signal pad area, an output signal pad area and an input signal pad area arranged on a periphery of the ground signal pad area and arranged opposite to each other, and a first pad area and a second pad area arranged on a periphery of the ground signal pad area and arranged opposite to each other;
where the driver IC includes a first side and a second side arranged opposite to each other, and a third side and a fourth side arranged opposite to each other, the third side and the fourth side are respectively adjacent to the first side and the second side; and
the output signal pad area corresponds to the first side, the input signal pad area corresponds to the second side, the first pad area corresponds to the third side, and the second pad area corresponds to the fourth side; and
the GOA pad area is arranged at one side of an edge of the output signal pad area.

In some embodiments, the quantity of the GOA pad areas is two, and the two GOA pad areas are respectively arranged at two ends of the input signal pad area.

In some embodiments, the two GOA pad areas are arranged symmetrically with respect to the input signal pad area.

In some embodiments, the driver IC further includes a first initialization signal pad area and a second initialization signal pad area. The first initialization signal pad area and the second initialization signal pad area are respectively arranged between the input signal pad area and the corresponding GOA pad area.

In some embodiments, the driver IC further includes a first initialization signal pad area and a second initialization signal pad area. The first pad area is multiplexed as the first initialization signal pad area, and the second pad area is multiplexed as the second initialization signal pad area.

In some embodiments, the first initialization signal pad area and the second initialization signal pad area each include a plurality of second pad groups; each of the plurality of second pad groups includes at least two adjacent second pads; and the second pads of each of the second pad groups are electrically connected with each other.

In some embodiments, the driver IC further includes a first initialization signal pad area and a second initialization signal pad area. The first initialization signal pad area and the second initialization signal pad area are respectively arranged at two ends of the input signal pad area.

Accordingly, an embodiment of the present disclosure further provides a display device, including a display panel and the above driver IC provided by the embodiment of the present disclosure. The display panel includes a display area and a peripheral area arranged around the display area, and the driver IC is bonded to the peripheral area.

DETAILED DESCRIPTION OF THE EMBODIMENTS

To make the objectives, technical solutions and advantages of the embodiments of the present disclosure clearer, the technical solutions of the embodiments of the present disclosure will be described clearly and completely in conjunction with the accompanying drawings of the embodiments of the present disclosure. Obviously, the described embodiments are a part of the embodiments of the present disclosure, but not all the embodiments. In the case of no conflict, the embodiments in the present disclosure and the features in the embodiments may be combined with each other. Based on the described embodiments of the present disclosure, all other embodiments obtained by those of ordinary skill in the art without creative work are within the protection scope of the present disclosure.

Unless otherwise defined, the technical terms or scientific terms used in the present disclosure shall have the ordinary meanings understood by persons of ordinary skill in the art to which the present disclosure belongs. Similar words such as "comprise" or "include" or the like used in the present disclosure mean that the elements or objects appearing before the word cover the elements or objects listed after the word and equivalents thereof, but do not exclude other elements or objects. Similar words such as "connect" or "link" are not limited to physical or mechanical connections, but may include electrical connections, whether direct or indirect. "Inner". "outer". "upper". "lower" and the like are only used to indicate the relative positional relationship. When the absolute position of the described object changes, the relative positional relationship may also change accordingly.

It should be noted that the shape and size of each graph in the accompanying drawings do not reflect the true scale, and are merely intended to illustrate the contents of the present disclosure. The same or similar reference numerals indicate the same or similar elements or elements having the same or similar functions throughout.

Figure 1:
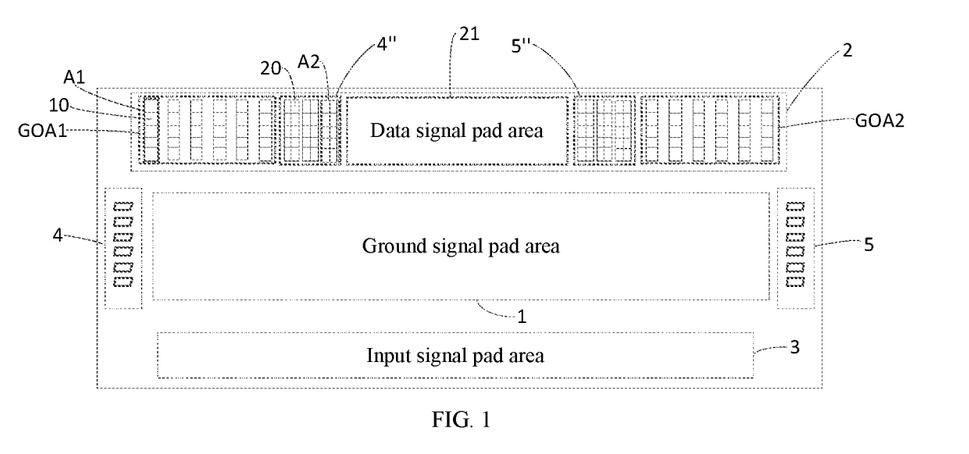
FIG. 1 is a schematic structural diagram of a driver IC provided in the related art.

A foldable screen typically has a size of about 8 inches to 10 inches, which is obviously larger than that of an ordinary cell phone. To make a high-resolution foldable product, in general cases, two cascaded ICs are needed for support. If the high-resolution foldable product can be realized by one single foldable IC, the cost can be reduced. As shown in FIG. 1. FIG. 1 is a schematic diagram of a driver IC in the related art. The driver IC includes: a ground signal pad area 1, an output signal pad area 2 and an input signal pad area 3 arranged on a periphery of the ground signal pad area 1 and arranged opposite to each other, and a first floating pad area 4 and a second floating pad area 5 arranged on the periphery of the ground signal pad area 1 and arranged opposite to each other. The output signal pad area 2 includes: a data signal pad area 21. GOA pad areas (denoted by GOA1 and GOA2) arranged on two sides of the data signal pad area 21, and a first initialization signal pad area 4" and a second initialization signal pad area 5" arranged between the GOA pad areas and the data signal pad area 21. The input signal pad area 3 is configured to be electrically connected with an FPC (flexible circuit board). The first floating pad area 4 and the second floating pad area 5 function as a support when the driver IC is bonded with a display panel. The first floating pad area 4 and the second floating pad area 5 are Dummy pad areas with no wiring inside. In order to improve the resolution of the large-size foldable product, it is necessary to increase the quantity of data signal pads in the data signal pad area 21. When the size of the single driver IC is fixed, due to the limit to the quantity of pads in the GOA pad areas (denoted by GOA1 and GOA2), the first initialization signal pad area 4" and the second initialization signal pad area 5", quantity of the data signal pads in the data signal pad area 21 is limited, which therefore is not conducive to the realization of the high-resolution foldable product. In a case that one single driver IC is configured to drive the foldable product to reduce the cost, there is a need of a driver IC which can not only ensure an unchanged quantity of pads in the GOA pad areas (denoted by GOA1 and GOA2), the first initialization signal pad area 4" and the second initialization signal pad area 5", but also increase the quantity of the data signal pads, that is, a low-cost single foldable driver IC capable of supporting high resolution needs to be designed, which is an urgent problem to be solved by those skilled in the art.

Figure 2:
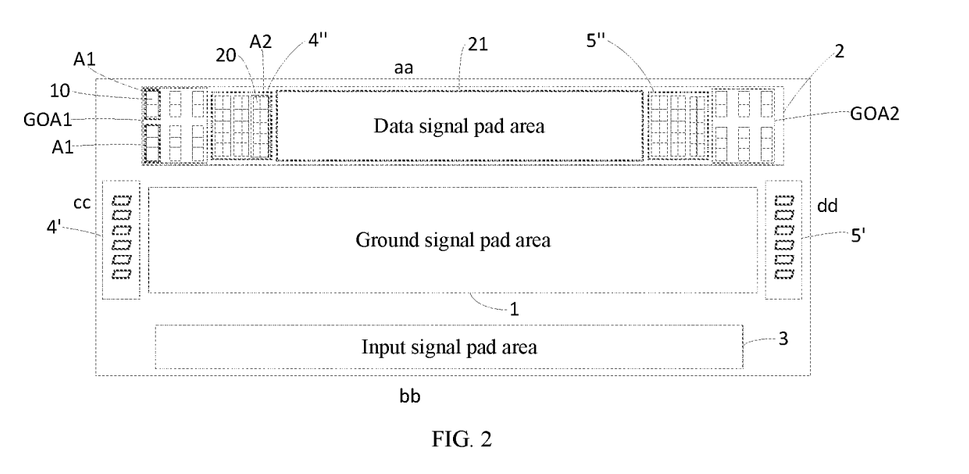
FIG. 2 is a schematic structural diagram of a driver IC provided by an embodiment of the present disclosure.
Figure 3:
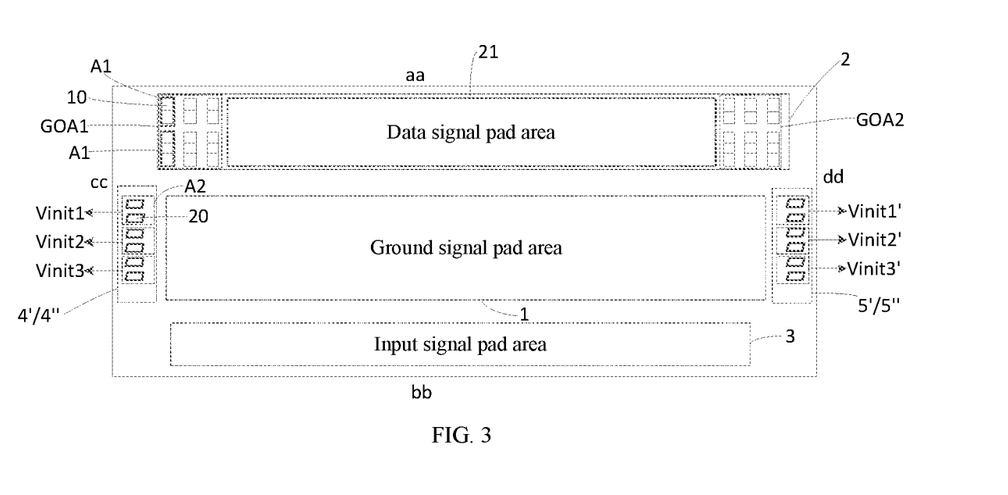
FIG. 3 is a schematic structural diagram of another driver IC provided by an embodiment of the present disclosure.

In view of this, an embodiment of the present disclosure provides a driver IC, as shown in FIG. 2 and FIG. 3, including at least one GOA pad area (for example, including two GOA pad areas, denoted by GOA1 and GOA2 respectively). Each of the GOA pad areas (GOA1 and GOA2) includes a plurality of rows and columns of first pads 10 (for example, 5 rows and 3 columns). Each column of the first pads 10 are divided into at least two first pad groups A1 arranged independently of each other (for example, each column of the first pads 10 are divided into two first pad groups A1 arranged independently of each other). Each of the first pad groups A1 includes at least two of the first pads 10 adjacent to each other (for example, one part of the first pad groups A1 includes two of the first pads 10 adjacent to each other, and the other part of the first pad groups A1 includes three of the first pads 10 adjacent to each other). The first pads 10 in each of the first pad groups A1 are electrically connected with each other.

The driver IC further includes a plurality of leads electrically connected with the first pad groups A1, and each of the first pad groups A1 is electrically connected with a different lead (not shown). That is, each first pad group A1 in the embodiment of the present disclosure correspondingly outputs one GOA signal (for example, a trigger signal, a clock signal, etc.). In addition, in the embodiment of the present disclosure, each GOA signal is formed by electrically connecting at least two first pads 10, to ensure that the driver IC has sufficient driving force.

It should be noted that the driver IC provided by the embodiment of the present disclosure is configured to provide electrical signals to a foldable display panel. The display panel generally includes a display area and a peripheral area. The display area includes gate lines, data lines, etc. The driver IC is bonded to the peripheral area. The peripheral area includes a gate driver circuit (GOA), etc. The GOA circuit generally includes a plurality of gate signal output terminals. The gate signal output terminals are correspondingly electrically connected with the gate lines and configured to input gate scanning signals to the gate lines line by line. The gate scanning signal output by the GOA circuit needs to be realized by the cooperation of the initial trigger signal, the clock signal, etc. The first pad groups A1 in the GOA pad area provided by the embodiment of the present disclosure may be pads for providing initial trigger signals, clock signals, etc., to the GOA circuit, and these pads are correspondingly bonded with pads on the display panel for providing initial trigger signals, clock signals, etc. to the GOA circuit.

As shown in FIG. 1, each of the GOA pad areas (GOA1 and GOA2) in the related art generally includes 20 first pad groups A1 arranged independently (for example, in FIG. 1, GOA1 and GOA2 each include 6 first pad groups A1 arranged independently). Each of the first pad groups A1 is formed by electrically connecting all the first pads 10 in one column (for example, one column includes 5 electrically connected first pads 10), so GOA1 and GOA2 each have 100 (20×5) first pads 10. In the above driver IC provided by the embodiment of the present disclosure, each column of the first pads 10 are divided into at least two first pad groups A1 arranged independently of each other. In the related art, 20 first pad groups A1 in each GOA pad area need 20 columns. However, in the embodiment of the present disclosure, 20 first pad groups A1 in each GOA pad area only need 10 columns, which can save 100 first pads 10. That is, in the embodiment of the present disclosure, by reducing the quantity of the first pads 10 corresponding to each GOA pad area, the occupied space of the GOA pad areas (GOA1 and GOA2) can be reduced, which can increase the space for manufacturing the data signal pads (when the driver IC is integrated with a foldable product, the data signal pads are configured to be electrically connected with data lines of the foldable product), thereby increasing the quantity of the data signal pads. Thus, when the driver IC is integrated with a large-size foldable product, a high-resolution foldable product can be realized based on a single driver IC.

In some embodiments, as shown in FIG. 2, the driver IC includes: a ground signal pad area 1, an output signal pad area 2 and an input signal pad area 3 arranged on a periphery of the ground signal pad area 1 and arranged opposite to each other, and a first pad area 4' and a second pad area 5' arranged on the periphery of the ground signal pad area 1 and arranged opposite to each other. The first pad area 4' can be mapped as the first floating pad area 4 in FIG. 1, and the second pad area 5' can be mapped as the second floating pad area 5 in FIG. 1.

The driver IC includes a first side aa and a second side bb arranged opposite to each other, and a third side cc and a fourth side dd arranged opposite to each other. The third side cc and the fourth side dd are respectively adjacent to the first side aa and the second side bb.

The output signal pad area 2 corresponds to the first side aa, the input signal pad area 3 corresponds to the second side bb, the first pad area 4' corresponds to the third side cc, and the second pad area 5' corresponds to the fourth side dd.

The GOA pad areas (GOA1 and GOA2) are arranged in an edge area of the output signal pad area 2.

In some embodiments, as shown in FIG. 2, the output signal pad area 2 further includes a data signal pad area 21, and the quantity of the GOA pad areas is two (GOA1 and GOA2).

The GOA pad areas (GOA1 and GOA2) are respectively arranged at two ends of the data signal pad area 21.

In some embodiments, as shown in FIG. 2, the two GOA pad areas (GOA1 and GOA2) may be arranged symmetrically with respect to the data signal pad area 21. Compared with GOA1 and GOA2 in the related art, the quantity of the first pads 10 in GOA1 and GOA2 in the present disclosure is reduced, so that the occupied space of GOA1 and GOA2 can be reduced, thereby increasing the space for manufacturing the data signal pad area 21; and the quantity of the data signal pads can be increased, thereby realizing the high-resolution foldable product.

In some embodiments, as shown in FIG. 3, the driver IC further includes a first initialization signal pad area 4" and a second initialization signal pad area 5". The first pad area 4' is multiplexed as the first initialization signal pad area 4", and the second pad area 5' is multiplexed as the second initialization signal pad area 5". That is, in the embodiment of the present disclosure, the first initialization signal pad area 4" and the second initialization signal pad area 5" are moved to the first pad area 4' and the second pad area 5' at the two sides of the ground signal pad area 1, which can further increase the space for manufacturing the data signal pad area 21 and further increase the quantity of the data signal pads, thereby further improving the resolution of the foldable product driven by the single driver IC, so as to design a low-cost single driver IC applicable to foldable products that can support higher resolution.

In some embodiments, as shown in FIG. 3, the first initialization signal pad area 4" and the second initialization signal pad area 5" each include a plurality of second pad groups A2. Each of the second pad groups A2 includes at least two second pads 20 adjacent to each other. The second pads 20 in each of the second pad groups A2 are electrically connected with each other. Each of the second pad groups A2 is configured to output an initialization signal, for example, Vinit1, Vinit2, Vinit3, Vinit1', Vinit2' and Vinit3' respectively representing the corresponding initialization signals output.

In some embodiments, in FIG. 1 and FIG. 2, the first initialization signal pad area 4" and the second initialization signal pad area 5" are respectively arranged between the data signal pad area 21 and the GOA pad area. The first initialization signal pad area 4" and the second initialization signal pad area 5" each include 3 second pad groups A2 arranged independently. Each of the second pad groups A2 is formed by electrically connecting 10 second pads 20 in two columns, so that the first initialization signal pad area 4" and the second initialization signal pad area 5" each have 30 (10×3) second pads 20. Compared with FIG. 1 in the related art, the embodiment of FIG. 2 of the present disclosure has the reduced occupied space of the GOA pad areas. Compared with FIG. 2, the embodiment of FIG. 3 of the present disclosure has the first initialization signal pad area 4" and the second initialization signal pad area 5" that are further moved to Dummy pad areas (the first pad area 4' and the second pad area 5') at the two sides of the driver IC. Dummy pads, which originally function as a support in the Dummy pad areas, can also be configured to output signals, thus increasing the utilization rate of the whole driver IC. When the driver IC is bonded to the display panel, the position corresponding to the Dummy pad area in the display panel is also convenient for lead layout. In this way, compared with FIG. 1, in FIG. 3, the occupied space of 100+30×2=160 pads is saved for manufacturing the data signal pads, which can improve the resolution by 160, thereby greatly improving the resolution of the large-size foldable product without increasing the cost of the driver IC.

Figure 4:
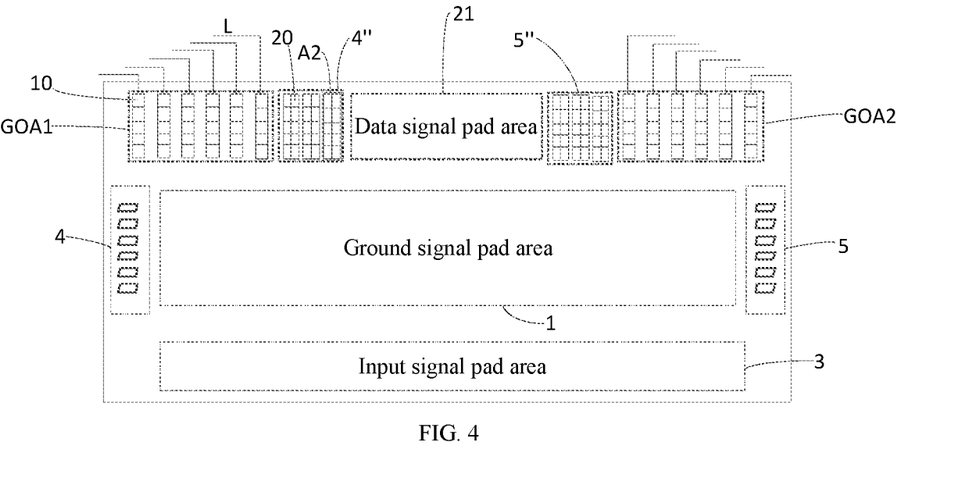
FIG. 4 is a schematic structural diagram of another driver IC provided in the related art.
Figure 5:
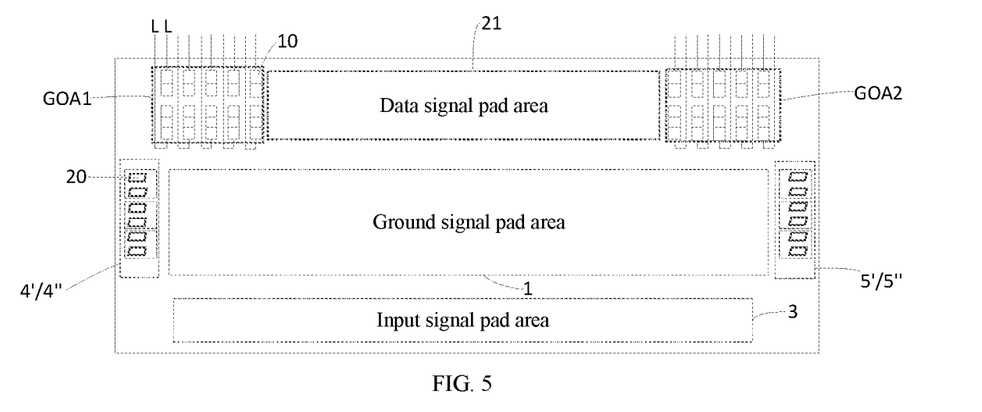
FIG. 5 is a schematic structural diagram of another driver IC provided by an embodiment of the present disclosure.
Figure 6:
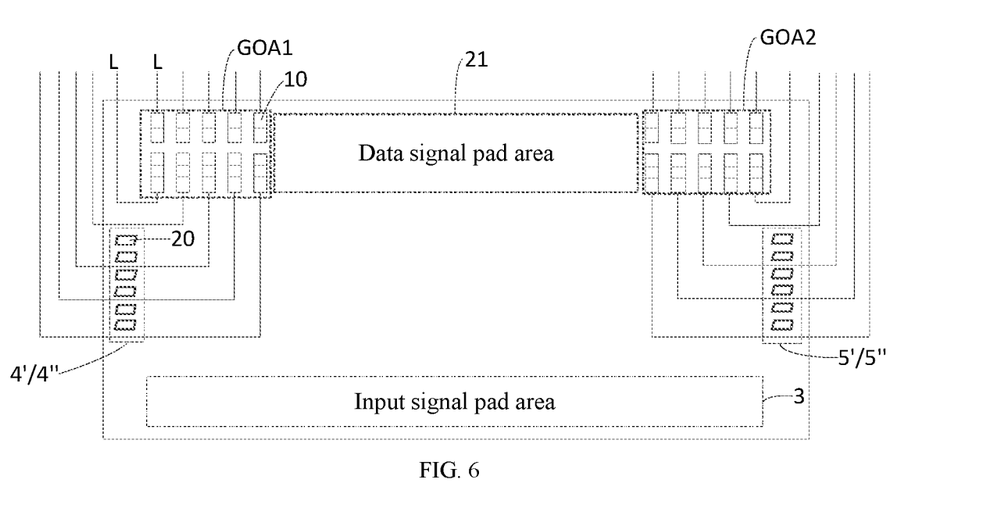
FIG. 6 is a schematic structural diagram of another driver IC provided by an embodiment of the present disclosure.
Figure 7:
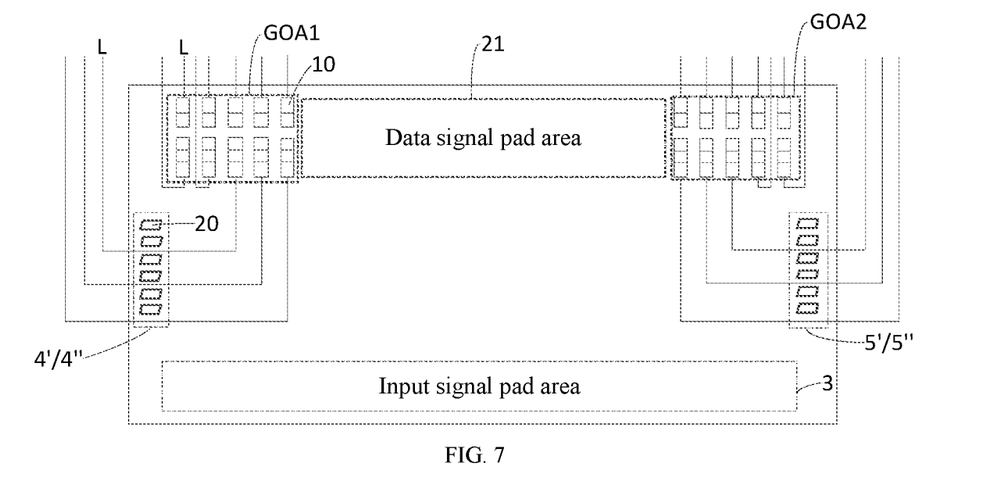
FIG. 7 is a schematic structural diagram of another driver IC provided by an embodiment of the present disclosure.

As shown in FIG. 4. FIG. 4 shows a lead-out manner of leads L electrically connected with the first pad groups A1 in the corresponding GOA pad areas (GOA1 and GOA2) in FIG. 1. The leads L electrically connected with the first pad groups A1 may be directly drawn and led out from top ends of the first pad group A1. However, with regard to the implementation in which each column includes two first pad groups A1 shown in FIG. 2 and FIG. 3 provided by the embodiment of the present disclosure, not all the leads L electrically connected with the first pad groups A1 can be directly drawn and led out from the top ends of the first pad group A1, which challenges the lead-out manner of the leads L electrically connected with the first pad groups A1 in the GOA pad areas. Therefore, in some embodiments, as shown in FIG. 5 to FIG. 7. FIG. 5 to FIG. 7 show a layout of the leads L indicated by taking the structure shown in FIG. 3 as an example. In FIG. 5 to FIG. 7, there are a large quantity of the first pad groups A1 in GOA1 and GOA2, and the leads L electrically connected with the first pad groups A1 away from the input signal pad area 3 are directly led out from the top ends of the first pad groups A1.

In some embodiments, as shown in FIG. 5, the leads L electrically connected with the first pad groups A1 close to the input signal pad area 3 are connected with bottom ends of the first pad groups A1, and are led out from gaps between every two adjacent columns of the first pads 10.

In some embodiments, as shown in FIG. 6, with regard to the GOA pad area (GOA1) close to the first pad area 4', the leads L electrically connected with the first pad groups A1 close to the input signal pad area 3 are connected with bottom ends of the first pad groups A1, and are led out from gaps in the first pad area 4'.

With regard to the GOA pad area (GOA2) close to the second pad area 5', the leads L electrically connected with the first pad groups A1 close to the input signal pad area 3 are connected with bottom ends of the first pad groups A1, and are led out from gaps in the second pad area 5'.

It should be noted that as shown in FIG. 6, since there is a gap between the first pad area 4' and GOA1 and between the second pad area 5' and GOA2, in the leads L electrically connected with the first pad groups A1 close to the input signal pad area 3, a part of the leads L may also be led out from between the first pad area 4' and GOA1 and between the second pad area 5' and GOA2.

In some embodiments, as shown in FIG. 7, with regard to the GOA pad area (GOA1) close to the first pad area 4', the leads L electrically connected with one part of the first pad groups A1 (in the leftmost two columns) close to the input signal pad area 3 are connected with bottom ends of the first pad groups A1, and are led out from gaps between every two adjacent columns of the first pads 10; the leads L electrically connected with the other part of the first pad groups (in the 3rd to 5th columns from the left) close to the input signal pad area 3 are connected with bottom ends of the first pad groups A1, and are led out from gaps in the first pad area 4'.

With regard to the GOA pad area (GOA2) close to the second pad area 5', the leads L electrically connected with one part of the first pad groups A1 (in the rightmost two columns) close to the input signal pad area 3 are connected with bottom ends of the first pad groups A1, and are led out from gaps between every two adjacent columns of the first pads; the leads L electrically connected with the other part of the first pad groups A1 (in the 3rd to 5th columns from the right) close to the input signal pad area 3 are connected with bottom ends of the first pad groups A1, and are led out from gaps in the second pad area 5'.

The lead layouts of the GOA pad areas shown in FIG. 5 to FIG. 7 provided by the embodiments of the present disclosure solve the problem of lead layouts in the case that the quantities of the pads in the GOA pad areas are reduced.

Figure 8:
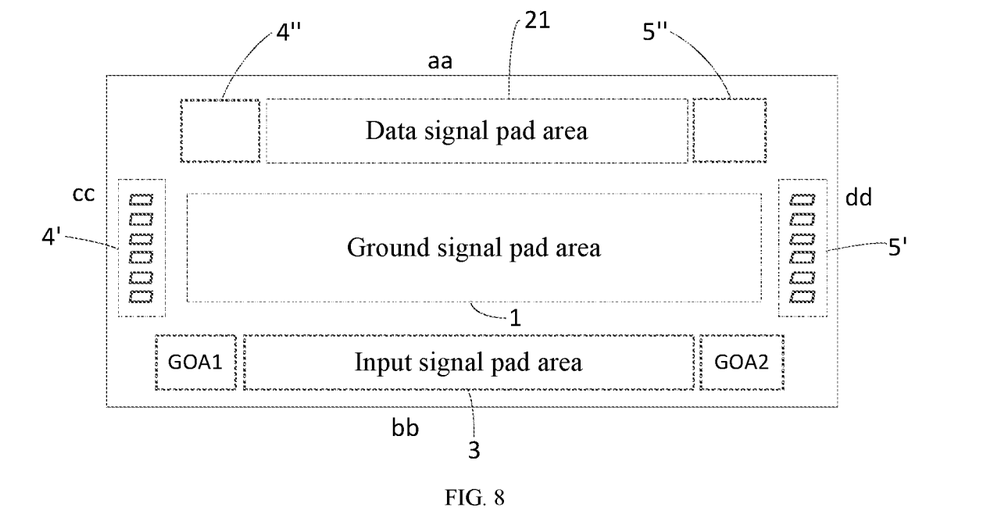
FIG. 8 is a schematic structural diagram of another driver IC provided by an embodiment of the present disclosure.

In some embodiments, as shown in FIG. 8, the driver IC includes: a ground signal pad area 1, an output signal pad area 2 and an input signal pad area 3 arranged on a periphery of the ground signal pad area 1 and arranged opposite to each other, and a first floating pad area 4' and a second floating pad area 5' arranged on the periphery of the ground signal pad area 1 and arranged opposite to each other. The first pad area 4' can be mapped as the first floating pad area 4 in FIG. 1, and the second pad area 5' can be mapped as the second floating pad area 5 in FIG. 1.

The driver IC includes a first side aa and a second side bb arranged opposite to each other, and a third side cc and a fourth side dd arranged opposite to each other. The third side cc and the fourth side dd are respectively adjacent to the first side aa and the second side bb.

The output signal pad area 2 corresponds to the first side aa, the input signal pad area 3 corresponds to the second side bb, the first pad area 4' corresponds to the third side cc, and the second pad area 5' corresponds to the fourth side dd.

The GOA pad areas (GOA1 and GOA2) are arranged at one side of an edge of the output signal pad area 3. Specifically, in FIG. 8, the structures of the GOA pad areas (GOA1 and GOA2) are the same as those in FIG. 2, and the first initialization signal pad area 4" and the second initialization signal pad area 5" are arranged at two ends of the data signal pad area 21. In FIG. 8, the GOA pad areas (GOA1 and GOA2) are moved to one side of the edge of the input signal pad area 3, which can increase the space of the data signal pad area 21 and increase the quantity of the data signal pads in the data signal pad area 21, thereby improving the resolution.

In some embodiments, as shown in FIG. 8, the quantity of the GOA pad areas (GOA1 and GOA2) is two, and the two GOA pad areas (GOA1 and GOA2) are respectively arranged at two ends of the input signal pad area 3.

In some embodiments, as shown in FIG. 8, the two GOA pad areas (GOA1 and GOA2) may be arranged symmetrically with respect to the input signal pad area 3.

Figure 9:
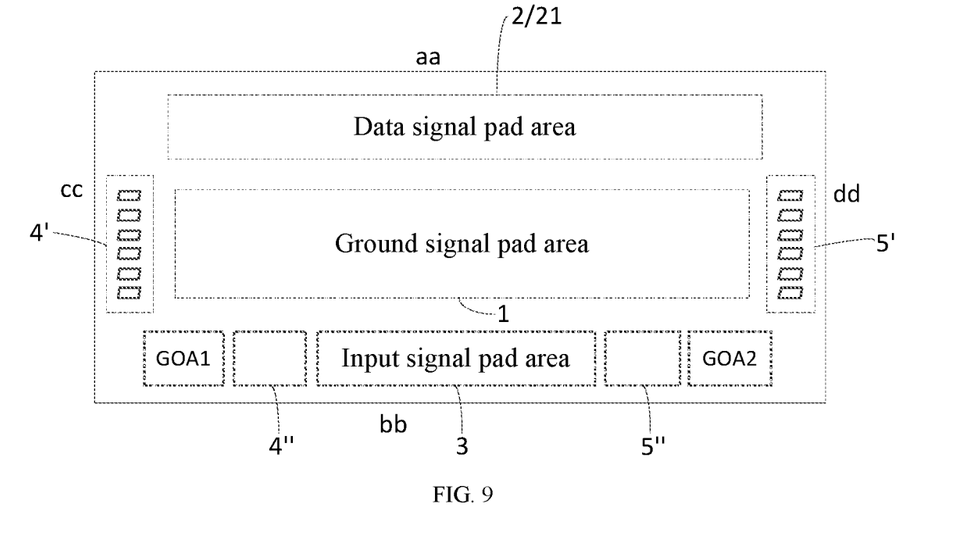
FIG. 9 is a schematic structural diagram of another driver IC provided by an embodiment of the present disclosure.

In some embodiments, as shown in FIG. 9, the two GOA pad areas (GOA1 and GOA2) are respectively arranged at two ends of the input signal pad area 3. The driver IC further includes a first initialization signal pad area 4" and a second initialization signal pad area 5", and the first initialization signal pad area 4" and the second initialization signal pad area 5" are respectively arranged between the input signal pad area 3 and the corresponding GOA pad area (GOA1 and GOA2). For example, the first initialization signal pad area 4" is arranged between the input signal pad area 3 and GOA1, and the second initialization signal pad area 5" is arranged between the input signal pad area 3 and GOA2. Thus, the GOA pad areas (GOA1 and GOA2), the first initialization signal pad area 4" and the second initialization signal pad area 5" are all moved to the two ends of the input signal pad area 3, which can further increase the space of the data signal pad area 21 and further increase the quantity of the data signal pads in the data signal pad area 21, thereby further improving the resolution.

Figure 10:
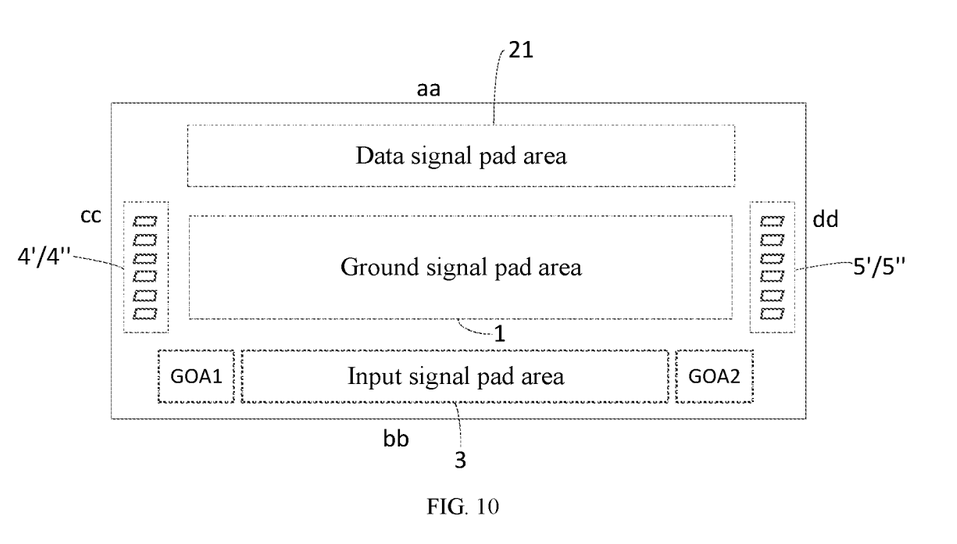
FIG. 10 is a schematic structural diagram of another driver IC provided by an embodiment of the present disclosure.

In some embodiments, as shown in FIG. 10, the two GOA pad areas (GOA1 and GOA2) are respectively arranged at two ends of the input signal pad area 3. The driver IC further includes a first initialization signal pad area 4" and a second initialization signal pad area 5". The first pad area 4' is multiplexed as the first initialization signal pad area 4", and the second pad area 5' is multiplexed as the second initialization signal pad area 5". That is, the GOA pad areas (GOA1 and GOA2) are moved to the two ends of the input signal pad area 3, and the first initialization signal pad area 4" and the second initialization signal pad area 5" are moved to the first pad area 4' and the second pad area 5' at the two sides of the ground signal pad area 1, which can further increase the space for manufacturing the data signal pad area 21 and further increase the quantity of the data signal pads, thereby further improving the resolution of the foldable product driven by the single driver IC, so as to design a single driver IC applicable to foldable products, which can support higher resolution and has low cost.

In some embodiments, as shown in FIG. 9 and FIG. 10, the first initialization signal pad area 4" and the second initialization signal pad area 5" each include a plurality of second pad groups A2. Each of the second pad groups A2 includes at least two second pads 20 adjacent to each other. The second pads 20 in each of the second pad groups A2 are electrically connected. For the structures of the first initialization signal pad area 4" and the second initialization signal pad area 5" shown in FIG. 9 and FIG. 10, reference can be made to the structures as shown in FIG. 3.

Figure 11:
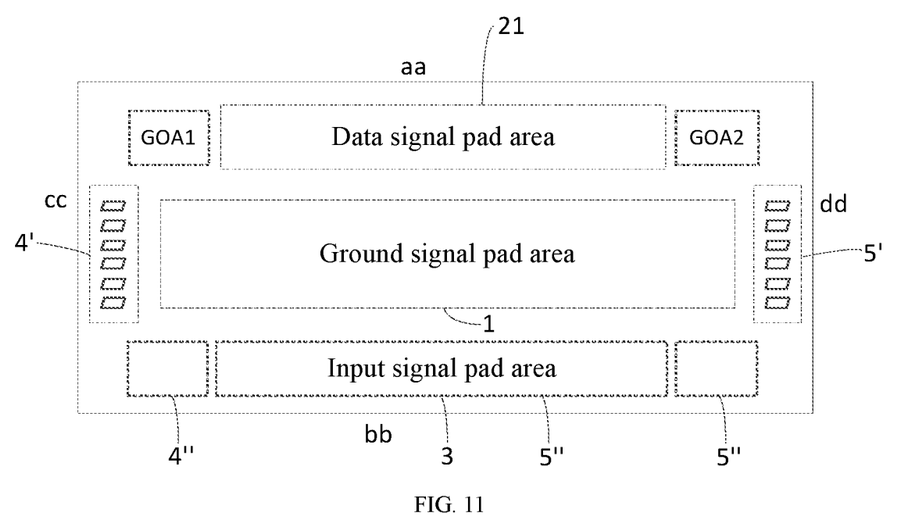
FIG. 11 is a schematic structural diagram of another driver IC provided by an embodiment of the present disclosure.

In some embodiments, as shown in FIG. 11, the two GOA pad areas (GOA1 and GOA2) are respectively arranged at two ends of the data signal pad area 21. The driver IC further includes a first initialization signal pad area 4" and a second initialization signal pad area 5", and the first initialization signal pad area 4" and the second initialization signal pad area 5" are respectively arranged at two ends of the input signal pad area 3. In some embodiments, in FIG. 11, the structures of the GOA pad areas (GOA1 and GOA2) are the same as those in FIG. 2. In FIG. 11, the first initialization signal pad area 4" and the second initialization signal pad area 5" are moved to the two ends of the input signal pad area 3, which can increase the space of the data signal pad area 21 and increase the quantity of the data signal pads in the data signal pad area 21, thereby improving the resolution.

It should be noted that the embodiments of the present disclosure only illustrate three lead-out manners of the leads L corresponding to the structure shown in FIG. 3. Of course, the lead-out manners of the leads L in FIG. 2 and FIG. 8 to FIG. 11 may also be similar to the corresponding lead-out manner in FIG. 3, and the leads L can be laid out according to the gaps in actual production.

Figure 12:
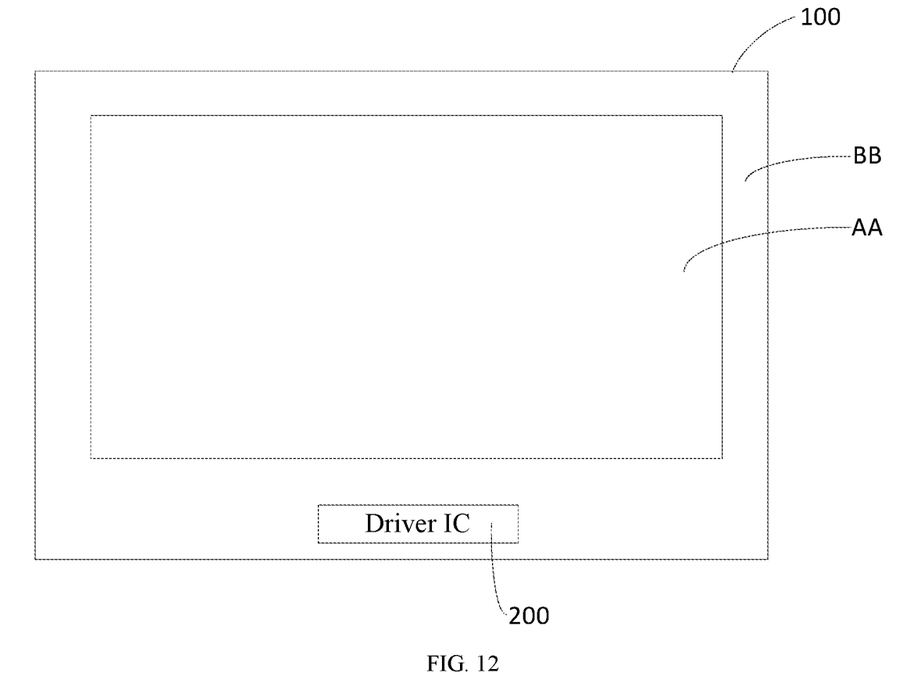
FIG. 12 is a structural schematic diagram of a display device provided by an embodiment of the present disclosure.

Based on the same inventive concept, an embodiment of the present disclosure further provides a display device, as shown in FIG. 12, including a display panel 100 and the driver IC 200 provided by the embodiments of the present disclosure. The display panel 100 includes a display area AA and a peripheral area BB arranged around the display area AA. The driver IC 200 is bonded to the peripheral area BB. The display area AA includes data lines, initialization signal lines, etc. The peripheral area further includes GOA. Data signal pads in a data signal pad area of the driver IC are configured to transmit data signals to the data lines. First pad groups in GOA pad areas are configured to transmit signals to initial trigger signal lines, clock signal lines or the like of the GOA. Second pad groups in a first initialization signal pad area and a second initialization signal pad area are configured to transmit initialization signals to the corresponding initialization signal lines.

The principle of the display device to solve the problems is similar to that of the aforementioned driver IC. Therefore, for the implementation of the display device, reference may be made to the implementation of the aforementioned driver IC, and the repetition is not described here. The display device may be: any product or component with a display or touch function, such as a cell phone, a tablet computer, a television, a display, a notebook computer, a digital photo frame, a navigator or the like.

In some embodiments, the above display panel may be a liquid crystal display (LCD) panel, an organic light-emitting diode (OLED) display panel, and of course other display panels, which is not limited here.

In some embodiments, the above display device provided by the embodiment of the present disclosure may also include other film layers well known to those skilled in the art, which will not be described in detail here.

By reducing the quantity of the first pads corresponding to each GOA pad area, the driver IC and the display device provided by the embodiments of the present disclosure can reduce the occupied space of the GOA pad areas, which can increase the space for manufacturing the data signal pads (when the driver IC is integrated with a foldable product, the data signal pads are configured to be electrically connected with data lines of the foldable product), thereby increasing the quantity of the data signal pads. Thus, when the driver IC is integrated with a large-size foldable product, a high-resolution foldable product can be realized based on a single driver IC.

Although the preferred embodiments of the present disclosure have been described, those skilled in the art can make additional changes and modifications to these embodiments once they know the basic inventive concepts. Therefore, the appended claims are intended to be construed to include the preferred embodiments and all changes and modifications that fall within the scope of the present disclosure.

It will be apparent that those skilled in the art can make various modifications and variations to the embodiments of the present disclosure without departing from the spirit and scope of the embodiments of the present disclosure. Thus, if such modifications and variations of the embodiments of the present disclosure fall within the scope of the claims of the present disclosure and the equivalent technologies thereof, the present disclosure is also intended to cover such modifications and variations.

What is claimed is:

1. A driver integrated circuit, IC, comprising: at least one gate driven on array, GOA, pad area;
   wherein each of the at least one GOA pad area comprises a plurality of first pads arranged in a plurality of rows and a plurality of columns;
      each of the plurality of columns of the first pads is divided into at least two first pad groups arranged independently of each other;
      each of the at least two first pad groups comprises at least two of the first pads adjacent to each other, and the first pads in each of the first pad groups are electrically connected with each other; and
   the driver IC further comprising a plurality of leads electrically connected with the first pad groups, each of the first pad groups being electrically connected with a different lead.

2. The driver IC according to claim 1, comprising: a ground signal pad area, an output signal pad area and an input signal pad area arranged on a periphery of the ground signal pad area and arranged opposite to each other, and a first pad area and a second pad area arranged on a periphery of the ground signal pad area and arranged opposite to each other; wherein
   the driver IC comprises a first side and a second side arranged opposite to each other, and a third side and a fourth side arranged opposite to each other, the third side and the fourth side are respectively adjacent to the first side and the second side;
   the output signal pad area corresponds to the first side, the input signal pad area corresponds to the second side, the first pad area corresponds to the third side, and the second pad area corresponds to the fourth side; and
   the GOA pad area is arranged in an edge area of the output signal pad area.

3. The driver IC according to claim 2, wherein the output signal pad area further comprises a data signal pad area, and quantity of the GOA pad areas is two; and
   the two GOA pad areas are respectively arranged on two ends of the data signal pad area.

4. The driver IC according to claim 3, wherein the two GOA pad areas are arranged symmetrically with respect to the data signal pad area.

5. The driver IC according to claim 2, wherein the leads electrically connected with the first pad groups away from the input signal pad area are directly led out from top ends of the first pad groups.

6. The driver IC according to claim 5, wherein the leads electrically connected with the first pad groups close to the input signal pad area are connected with bottom ends of the first pad groups, and are led out from gaps between two adjacent columns of the first pads.

7. The driver IC according to claim 5, wherein for the GOA pad area close to the first pad area, the leads electrically connected with the first pad groups close to the input signal pad area are connected with bottom ends of the first pad groups, and are led out from gaps in the first pad area; and
   for the GOA pad area close to the second pad area, the leads electrically connected with the first pad groups close to the input signal pad area are connected with bottom ends of the first pad groups, are led out from gaps in the second pad area.

8. The driver IC according to claim 5, wherein for the GOA pad area close to the first pad area, the leads electrically connected with one part of the first pad groups close to the input signal pad area are connected with bottom ends of the first pad groups, and are led out from gaps between two adjacent columns of the first pads; the leads electrically connected with the other part of the first pad groups close to the input signal pad area are connected with bottom ends of the first pad groups, and are led out from gaps in the first pad area; and
   for the GOA pad area close to the second pad area, the leads electrically connected with one part of the first pad groups close to the input signal pad area are connected with bottom ends of the first pad groups, and are led out from gaps between two adjacent columns of the first pads; the leads electrically connected with the other part of the first pad groups close to the input signal pad area are connected with bottom ends of the first pad groups, and are led out from gaps in the second pad area.

9. The driver IC according to claim 1, comprising: a ground signal pad area, an output signal pad area and an input signal pad area arranged on a periphery of the ground signal pad area and arranged opposite to each other, and a first pad area and a second pad area arranged on a periphery of the ground signal pad area and arranged opposite to each other;
   wherein the driver IC comprises a first side and a second side arranged opposite to each other, and a third side and a fourth side arranged opposite to each other, the third side and the fourth side are respectively adjacent to the first side and the second side; and
   the output signal pad area corresponds to the first side, the input signal pad area corresponds to the second side, the first pad area corresponds to the third side, and the second pad area corresponds to the fourth side; and
   the GOA pad area is arranged at one side of an edge of the output signal pad area.

10. The driver IC according to claim 9, wherein quantity of the GOA pad areas is two, and the two GOA pad areas are respectively arranged at two ends of the input signal pad area.

11. The driver IC according to claim 10, wherein the two GOA pad areas are arranged symmetrically with respect to the input signal pad area.

12. The driver IC according to claim 9, further comprising a first initialization signal pad area and a second initialization signal pad area;
   wherein the first initialization signal pad area and the second initialization signal pad area are respectively arranged between the input signal pad area and the corresponding GOA pad area.

13. The driver IC according to claim 2, further comprising a first initialization signal pad area and a second initialization signal pad area;
   wherein the first pad area is multiplexed as the first initialization signal pad area, and the second pad area is multiplexed as the second initialization signal pad area.

14. The driver IC according to claim 13, wherein the first initialization signal pad area and the second initialization signal pad area each comprise a plurality of second pad groups;
  each of the plurality of second pad groups comprises at least two adjacent second pads; and
  the second pads of each of the second pad groups are electrically connected with each other.

15. The driver IC according to claim 2, further comprising a first initialization signal pad area and a second initialization signal pad area;
  wherein the first initialization signal pad area and the second initialization signal pad area are respectively arranged at two ends of the input signal pad area.

16. A display device, comprising a display panel and the driver IC according to claim 1, wherein the display panel comprises a display area and a peripheral area arranged around the display area, and the driver IC is bonded to the peripheral area.

17. The display device according to claim 16, wherein the driver IC further comprises: a ground signal pad area, an output signal pad area and an input signal pad area arranged on a periphery of the ground signal pad area and arranged opposite to each other, and a first pad area and a second pad area arranged on a periphery of the ground signal pad area and arranged opposite to each other; wherein
  the driver IC comprises a first side and a second side arranged opposite to each other, and a third side and a fourth side arranged opposite to each other, the third side and the fourth side are respectively adjacent to the first side and the second side;
  the output signal pad area corresponds to the first side, the input signal pad area corresponds to the second side, the first pad area corresponds to the third side, and the second pad area corresponds to the fourth side; and
  the GOA pad area is arranged in an edge area of the output signal pad area.

18. The display device according to claim 17, wherein the output signal pad area further comprises a data signal pad area, and quantity of the GOA pad areas is two; and
  the two GOA pad areas are respectively arranged on two ends of the data signal pad area.

19. The display device according to claim 18, wherein the two GOA pad areas are arranged symmetrically with respect to the data signal pad area.

20. The display device according to claim 17, wherein the leads electrically connected with the first pad groups away from the input signal pad area are directly led out from top ends of the first pad groups.

\* \* \* \* \*